United States Patent
Aggarwal et al.

[19]

[11] Patent Number: 5,870,408
[45] Date of Patent: Feb. 9, 1999

[54] METHOD AND APPARATUS FOR ON DIE TESTING

[75] Inventors: Sandeep K. Aggarwal, Santa Cruz; David F. Bertucci, San Jose; Marc E. Levitt, Sunnyvale, all of Calif.

[73] Assignee: Sun Microsystems, Inc., Palo Alto, Calif.

[21] Appl. No.: 641,308

[22] Filed: Apr. 30, 1996

[51] Int. Cl.$^6$ .................................................. G01R 31/28
[52] U.S. Cl. ................................ 371/22.1; 324/757
[58] Field of Search ........................... 371/22.1, 22.3, 371/25.1, 757, 758, 765; 324/73 R, 763, 158.1; 327/565, 408; 365/201, 230.08, 226; 364/550, 481, 489

[56] References Cited

U.S. PATENT DOCUMENTS

| | | | |
|---|---|---|---|
| 4,875,003 | 10/1989 | Burke | 324/73 R |
| 4,945,395 | 7/1990 | Suehrio | 357/40 |
| 5,369,646 | 11/1994 | Shikatani | 371/22.5 |
| 5,475,330 | 12/1995 | Watanabe et al. | 327/408 |
| 5,519,355 | 5/1996 | Nguyen | 327/565 |
| 5,539,325 | 7/1996 | Rostoker et al. | 324/763 |
| 5,557,573 | 9/1996 | McClure | 365/201 |
| 5,559,744 | 9/1996 | Kuriyama et al. | 365/201 |

*Primary Examiner*—Robert W. Beausoliel, Jr.
*Assistant Examiner*—Nadeem Iqbac
*Attorney, Agent, or Firm*—Forrest Gunnison

[57] ABSTRACT

Circuits and methods of testing an integrated circuit die are disclosed. Active logic setting circuits are incorporated into input cells of a die. During testing, the active logic setting circuits weakly drive the input cells to a definite logic level. Therefore, the necessity of connecting probes to all of the input pads to prevent floating signals in the die is eliminated. Furthermore, during normal operations the active logic setting circuits have little or no effect on the performance of the die.

31 Claims, 5 Drawing Sheets

METHOD AND APPARATUS FOR ON DIE TESTING

BACKGROUND OF THE INVENTION

1. Field of the Invention

The present invention relates to testing of integrated circuits (ICs), and more particularly to reducing the number of probes necessary to test logic blocks of an integrated circuit before the integrated circuit is packaged.

2. Description of Related Art

Integrated circuits are mass produced on semiconductor wafers. Typically, the integrated circuits are formed to occupy a rectangular area of a semiconductor wafer. Before packaging, the integrated circuit on the rectangular semiconductor material is called a die. The semiconductor wafer, which is typically round, contains many dies. Depending on the size of the wafer and the size of the die a single wafer can contain hundreds of dies. FIG. 1 shows a simplified example of semiconductor wafer 100 containing thirty-seven dies 110.

The cost of packaging a die is a major factor in the overall production cost of a chip. Therefore, a die is often tested prior to packaging to prevent needless packaging of a non-functional die.

Furthermore, the dies are typically tested before the semiconductor wafer is cut into individual dies. Therefore, if the vast majority of the integrated circuits are non-functional, the cost of cutting the wafer can be avoided. In addition, handling of the semiconductor wafer during testing is easier than handling each individual die.

Typically during wafer testing, probes are placed on the bonding pads of a die. The probes either supply signals to input bonding pads or monitor signals on the output bonding pads. FIG. 2 shows a simplified representation of a single die containing a microprocessor. In FIG. 2, die 200 contains forty bonding pads 205 which would correspond to forty pins of a packaged chip. A real microprocessor could contain over three hundred bonding pads.

Except for power bonding pads 207 and ground bonding pads 208, bonding pads 205 are coupled to corresponding interface cells 210. Each interface cell 210 could be a dedicated input cell, a dedicated output cell, or an input/output (I/O) cell. As used herein, input cell refers to both dedicated input cells and input/output cells. Die 200 also contains various logic blocks. For a microprocessor, the logic blocks can include data cache 210, instruction cache 220, memory management unit (MMU) 230, floating point unit (FPU) 240, integer unit 250, branch prediction unit 260, mode select unit 270, for example.

While testing a die, all of the bonding pads coupled to input cells (i.e. dedicated input cells or input/output cells) must be connected to a probe to provide a definite logic level on the pads. The term input bonding pad as used herein refers to a bonding pad that is coupled to an input cell. If an input bonding pad is not connected to a probe the pad "floats" at an indefinite logic level. The interface cells coupled to the floating pad provide an indeterminate floating signal to the various logic cells. Floating signals on the die cause spurious signals which makes testing inaccurate.

Even if only a single logic block is being tested, all of the input bonding pads must be forced to a definite logic level. For example, if a test is to be performed only on data cache 210, even bonding pads which are coupled to input cells which are not coupled to data cache 210 must be driven by a probe to a definite level. For example, bonding pad 281, which is coupled to input cell 212, must still be coupled to a probe so that bonding pad 281 is driven to a definite level; eventhough, input cell 212 is only coupled to FPU 240. Similarly, if only FPU 240 is being tested, bonding pad 281, which is coupled to input cell 211, must be driven to a definite level; eventhough, input cell 211 is only coupled to integer unit 250.

As integrated circuits have transitioned to smaller geometry sizes, the complexity of integrated circuit has increased. The increasing complexity leads to higher integration which requires increasing number of bonding pads for communications into and out of a chip. However, for many complex chips, such as microprocessors, the number of bonding pads has made connecting a probe to each bonding pad very difficult and time consuming.

Some chips have incorporated passive devices such as pull-up resistors between the input lines and the positive supply voltage to provide definite logic levels. However, this method degrades the performance of the chip in normal (i.e. non-test) modes since the drive supplied by the pull-up resistor must be overcome by the input signal or the output signal on an input/output line. Furthermore, this method is not feasible in complex high density circuits since passive devices such as resistors consume too much area.

Hence, there is a need for a method or a circuit to provide definite logic levels on bonding pads of a die during testing without the need of driving every bonding pad from an external source and without degrading the normal performance of the die. Specifically, the method or circuit must be able to drive input cells (i.e. dedicated input cells and input/output cells) to definite logic levels without a probe being connected to the input bonding pads. Furthermore, the circuit and method must not hamper the operation of the integrated circuit in non-test circumstances.

SUMMARY

In accordance with the present invention methods and circuits are disclosed for testing an integrated circuit die. By creating a die incorporating active logic setting circuits within input cells, the necessity of connecting probes to all input cells of a die during testing is eliminated. Furthermore the active logic setting circuits do not degrade performance of the die during normal operation.

Each input cells of a die, created in accordance with one embodiment of the invention, incorporates an active logic setting circuit. The active logic setting circuits are activated and deactivated by a control signal line. If the active logic setting circuits are activated, the active logic setting circuits weakly drives the input cell to a definite logic circuit. If the active logic setting circuits are deactivated, the active logic setting circuits have little or no effect on the input cells. In dies made in accordance to other embodiments of the invention, multiple control lines cause different subsets of input cells to be driven to different definite logic levels.

In a method to test a die, in accordance to one embodiment of the present invention, probes are connected to a subset of bonding pads. A control signal is generated to the input cells which causes the input cells to be weakly driven to a definite logic level. A subset of the probes provide input signals while other probes monitor output signals. For methods in accordance to other embodiments of the invention, multiple control signals are used to drive different subsets of input cells to different definite logic levels.

DETAILED DESCRIPTION

According to the principles of this invention, a unique active logic setting circuit relieves prior art requirements of placing a probe on every input bonding pad. The present invention controls logic level of unconnected input cells by providing a weak-pull down or a weak pull-up if a test mode control signal is received.

As used herein, a weak pull-down drives a low current, high impedance logic low onto a line. Due to the low current and high impedance, another element is still able to drive the line, that is connected to the weak pull-down, to a logic high. Similarly, a weak pull-up drives a low current, high impedance logic high onto a line. Due to the low current and high impedance, another element is still able to drive the line, that is connected to the weak pull-up, to a logic low.

Figure 1:
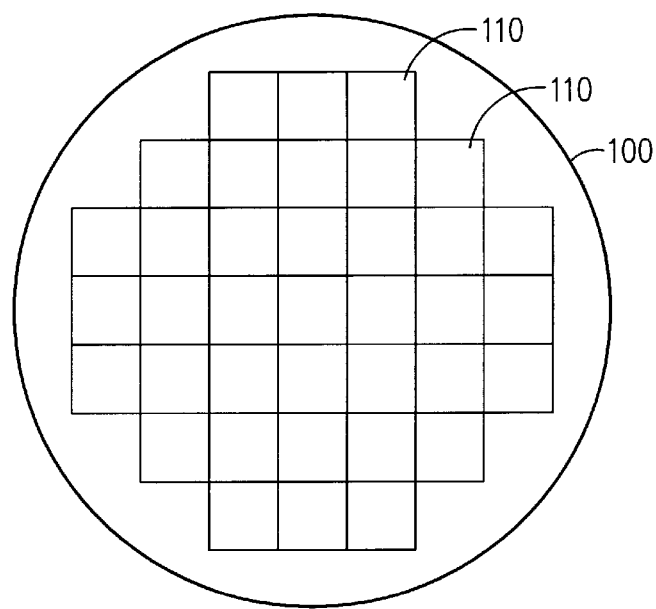
FIG. 1 shows a silicon wafer with a multitude of dies each of which contains an integrated circuit.
Figure 3:
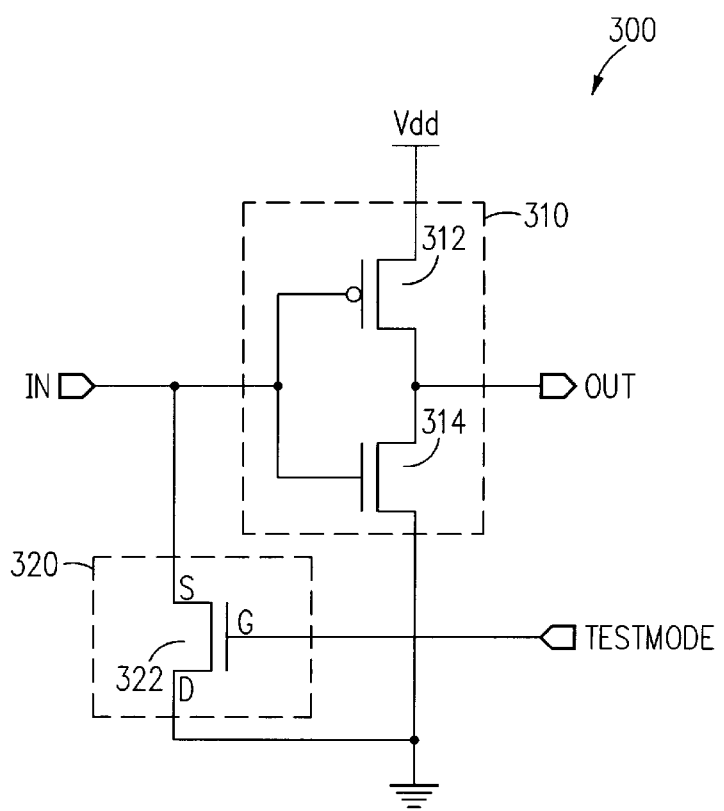
FIG. 3 shows a dedicated input cell incorporating a pull-down logic setting circuit according to one embodiment of the present invention.

FIG. 3 shows dedicated inverting input cell 300, having input terminal IN, output terminal OUT, and test mode control terminal TESTMODE. To avoid confusion, the lines connected to the terminals are given the same names as the terminals. Generally, input terminal IN is coupled to a bonding pad and output terminal OUT is coupled to internal circuitry on the die. Test mode control terminal TESTMODE can be coupled to a bonding pad or to internal circuitry on the die.

Dedicated inverting input cell 300 comprises inverter 310 and active logic setting circuit 320. Inverter 310 comprises p-channel transistor 312 and n-channel transistor 314. The particular circuitry of dedicated inverting input cell 300 is only illustrative. Many dedicated input cells are well known in the art. Active logic setting circuit 320 can be used with any dedicated input cell circuit whether inverting or non-inverting.

In this embodiment, active logic setting circuit 320 includes n-channel transistor 322. Source terminal S of n-channel transistor 322 is coupled to input terminal IN; drain terminal D of n-channel transistor 322 is coupled to ground; and gate terminal G of n-channel transistor 322 is coupled to test mode control terminal TESTMODE.

If test mode control line TESTMODE is asserted, active logic setting circuit 320 is activated so that active logic setting circuit 320 drives input terminal IN to a valid logic level. In the embodiment using n-channel transistor 322, input terminal IN is driven to a logic low by n-channel transistor 322 if test mode control line TESTMODE is asserted.

Active logic setting circuit 320 only provides a weak driving force on input terminal IN so that if a probe is connected to the bonding pad that is coupled to input terminal IN, the probe can overpower active logic setting circuit 320. The signal from the probe is then inverted by invertor 310 and driven to the internal circuitry of the die on output terminal OUT.

In the embodiment using n-channel transistor 322, n-channel transistor 322 is made to have a larger gate length than other transistors on the die so that n-channel transistor 322 will have a smaller current drive. Therefore, n-channel transistor 322 will only provide a weak pull-down on input terminal IN. For example, if standard transistors, such as n-channel transistor 314, on a die containing dedicated inverting input cell 300, has a first gate length of 0.42 microns, n-channel transistor 322 should have a second gate length of 0.49 microns or greater.

If the die is not in a test mode, test mode control line TESTMODE, is not asserted. Consequently, logic setting circuit 320 should be deactivated. When the die is not in test mode, active logic setting circuit 320 has almost no effect on input terminal IN. Any signal coming into dedicated inverting input cell 300 on input terminal IN is inverted by invertor 310 and provided to internal circuitry on the die on output terminal OUT.

In the embodiment using n-channel transistor 322, if test mode control line TESTMODE is not asserted, n-channel transistor 322 is deactivated and has no measurable effect on input terminal IN.

Figure 4:
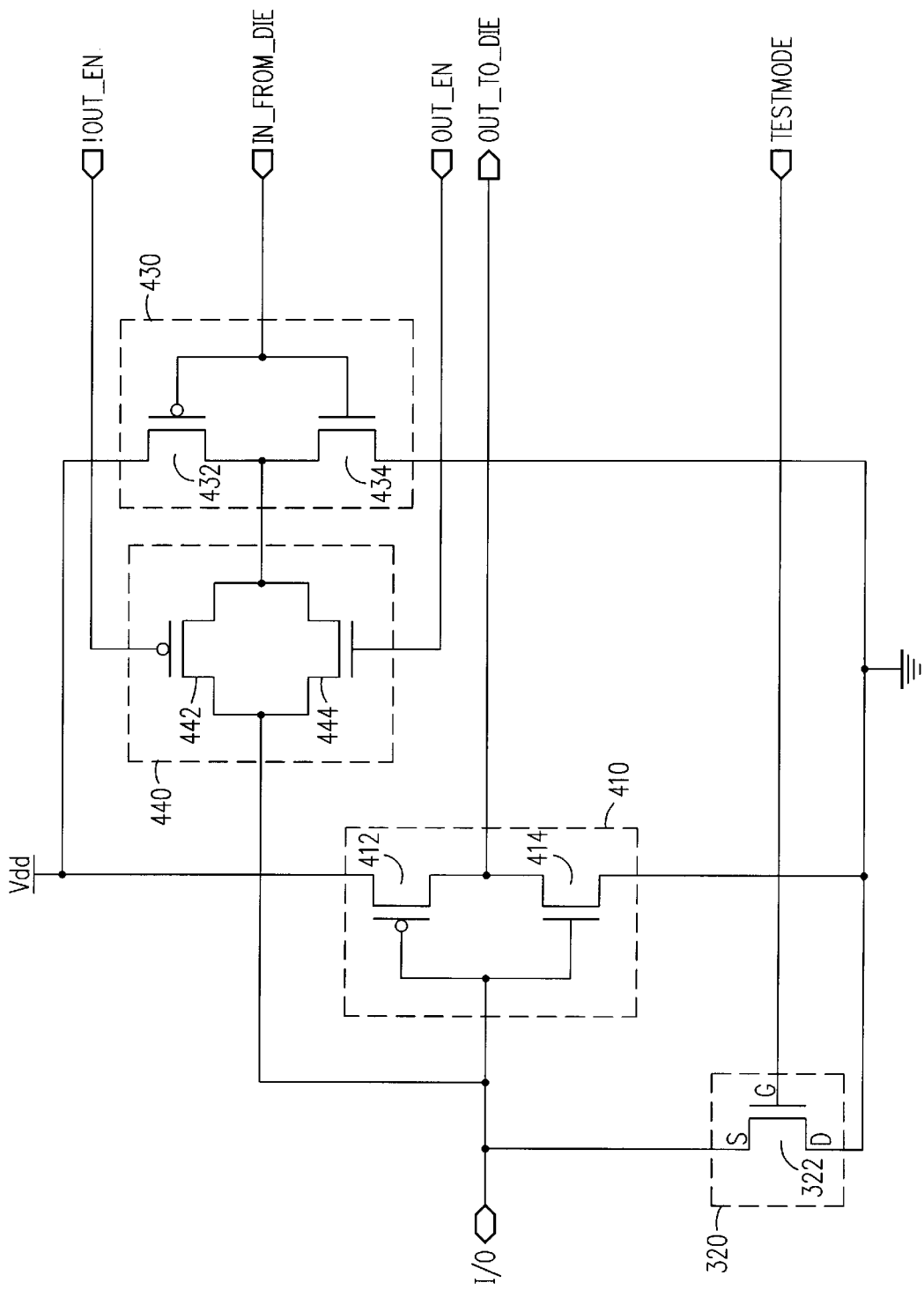
FIG. 4 shows an input/output cell incorporating a pull down logic setting circuit according to one embodiment of the present invention.

Active logic setting circuit 320 is also used with input/output cells. FIG. 4 shows inverting input/output cell 400 having input/output terminal I/O, output enable terminal OUT_EN, inverted output enable terminal !OUT_EN, input terminal IN_FROM_DIE, output terminal OUT_TO_DIE, and test mode control terminal TESTMODE. Generally, input/output terminal I/O is coupled to a bonding pad; while output enable terminal OUT_EN, inverted output enable terminal !OUT_EN, input terminal IN_FROM_DIE, and output terminal OUT_TO_DIE are all coupled to internal circuitry on the die. Test mode control terminal TESTMODE can be coupled to either a bonding pad or internal circuitry on the die.

Inverting input/output cell 400 comprises input invertor 410, the n-channel embodiment of active logic setting circuit 320, output invertor 430, and transmission gate 440. Output invertor 430 is formed with p-channel transistor 432 and n-channel invertor 434. Transmission gate 440 is formed with p-channel invertor 442 and n-channel invertor 444. Input invertor 410 is formed with p-channel transistor 412 and n-channel invertor 414. The particular circuitry of inverting input/output cell 400 is only illustrative. Many input/output cells are well known in the art. Active logic setting circuit 320 can be used with any input/output cell circuit, whether inverting or non-inverting.

In input/output cell 400, source terminal S of n-channel transistor 322 is coupled to input/output terminal I/O; drain terminal D of n-channel transistor 322 is coupled to ground; and gate terminal G of n-channel transistor 322 is coupled to test mode control terminal TESTMODE.

If inverting input/output cell 400 is in input mode, i.e. used as an input cell, output enable terminal OUT_EN is driven to logic low to deactivate n-channel transistor 444. Additionally, inverted output enable terminal !OUT_EN is driven to logic high to deactivate p-channel transistor 442. Therefore, output invertor 430 is electrically decoupled from input/output terminal I/O. Consequently, input/output terminal I/O is only driven by active logic setting circuit 320 or an external driver coupled to the bonding pad that is coupled to input/output terminal I/O.

If inverting input/output cell 400 is in output mode, i.e. used as an output cell, output enable terminal OUT_EN is driven to logic high to activate n-channel transistor 444. Additionally, inverted output enable terminal !OUT_EN is driven to logic low to activate p-channel transistor 442. Therefore, output invertor 430 is electrically coupled to input/output terminal I/O. Consequently, input/output terminal I/O is driven by output invertor 430 and by active logic setting circuit 320.

If test mode control line TESTMODE is asserted, input/output terminal I/O is driven to a logic low by n-channel transistor 322. As explained above, active logic setting circuit 320 only provides a weak driving force on input/output terminal I/O. Therefore, in input mode, if a probe is connected to the bonding pad that is coupled to input/output terminal I/O, the probe can overpower active logic setting circuit 320. The signal from the probe is then inverted by invertor 410 and driven to the internal circuitry of the die on output terminal OUT_TO_DIE.

Similarly, if inverting input/output cell 400 is in output mode, active logic setting circuit 320 is overpowered by transmission gate 440. Therefore, an input signal on input terminal IN_FROM_DIE is inverted by output invertor 430 and passes through transmission gate 440 onto input/output terminal I/O. As explained above, if standard transistors, such as n-channel transistor 444, on a die containing inverting input/output cell 400, has a gate length of 0.42 microns, n-channel transistor 322 should have a gate length of 0.49 microns or greater. If the die is not in a test mode, test mode control line TESTMODE, is not asserted. Consequently, n-channel transistor 322 is deactivated.

Figure 5:
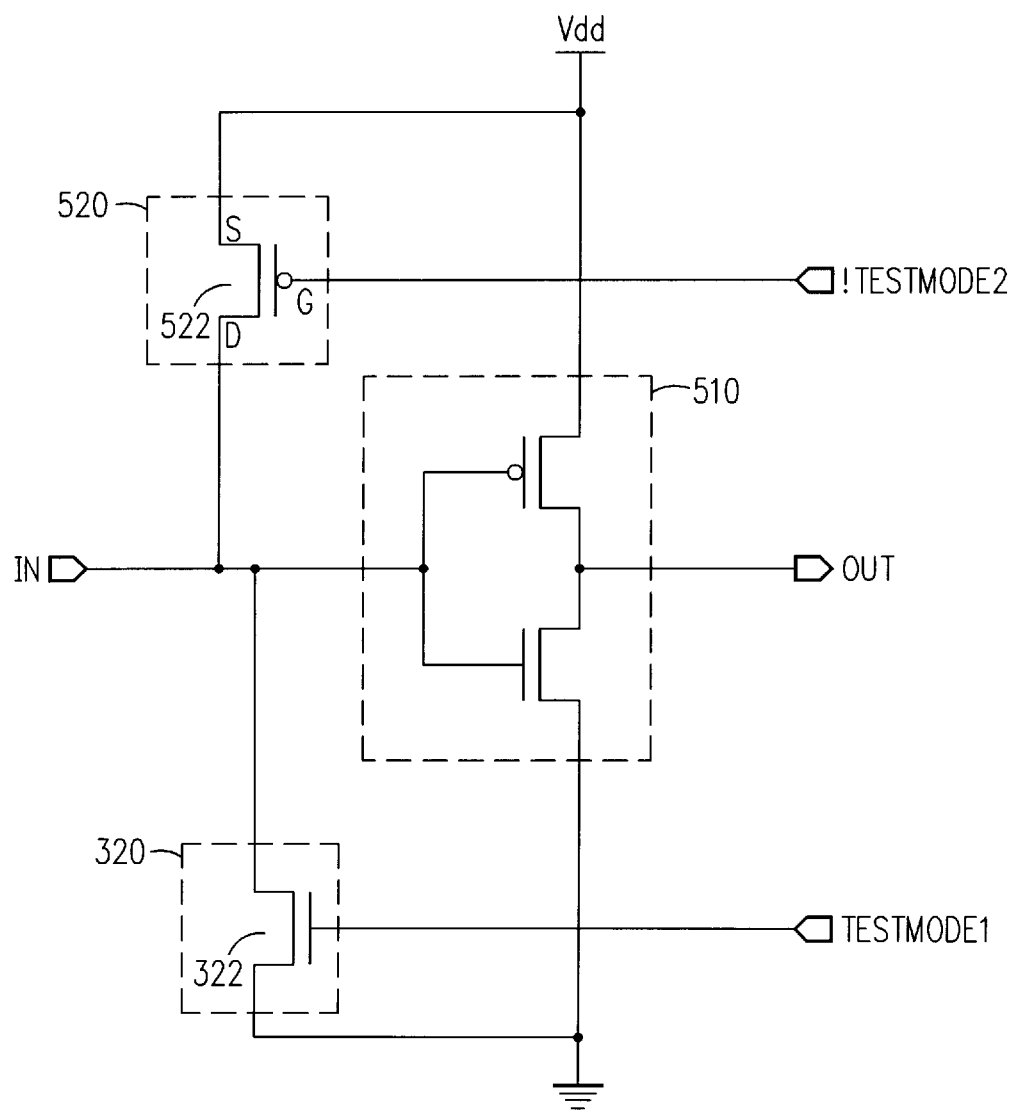
FIG. 5 shows a dedicated input cell incorporating a pull-down logic setting circuit and a pull-up logic setting circuit according to one embodiment of the present invention.

FIG. 5 shows dedicated inverting input cell 500 using a pull-up version of active logic setting circuit 520 and a pull-down version of active logic setting circuit 320. Active logic setting circuit 520 can be used without active logic setting circuit 320. Furthermore, active logic setting circuit 520 can also be used in input/output cells.

Since dedicated inverting input cell 500 is equivalent to dedicated inverting input cell 300 except for active logic setting circuit 520 and a second test mode control terminal, dedicated inverting input cell 500 is not described in detail. In this embodiment, active logic setting circuit 520 is p-channel transistor 522. Drain terminal D of p-channel transistor 522 is coupled to input terminal IN; Source terminal S of p-channel transistor 522 is coupled to positive supply voltage Vdd; and gate terminal G of p-channel transistor 522 is coupled to inverted test mode control terminal !TESTMODE2.

If the die is in a first test mode, test mode control terminal TESTMODE1 is driven to logic high which activates n-channel transistor 322. Consequently, input terminal IN is weakly pulled to a logic low state.

However, if the die is in a second test mode, inverted test mode control terminal !TESTMODE2 is driven to logic low. Therefore, p-channel transistor 522 is activated. Consequently, p-channel transistor 522 drives input terminal IN to a logic high level. P-channel transistor 522 is made to have a longer gate length than other transistors on the die. Therefore, p-channel transistor only provides a weak pull-up.

Figure 2:
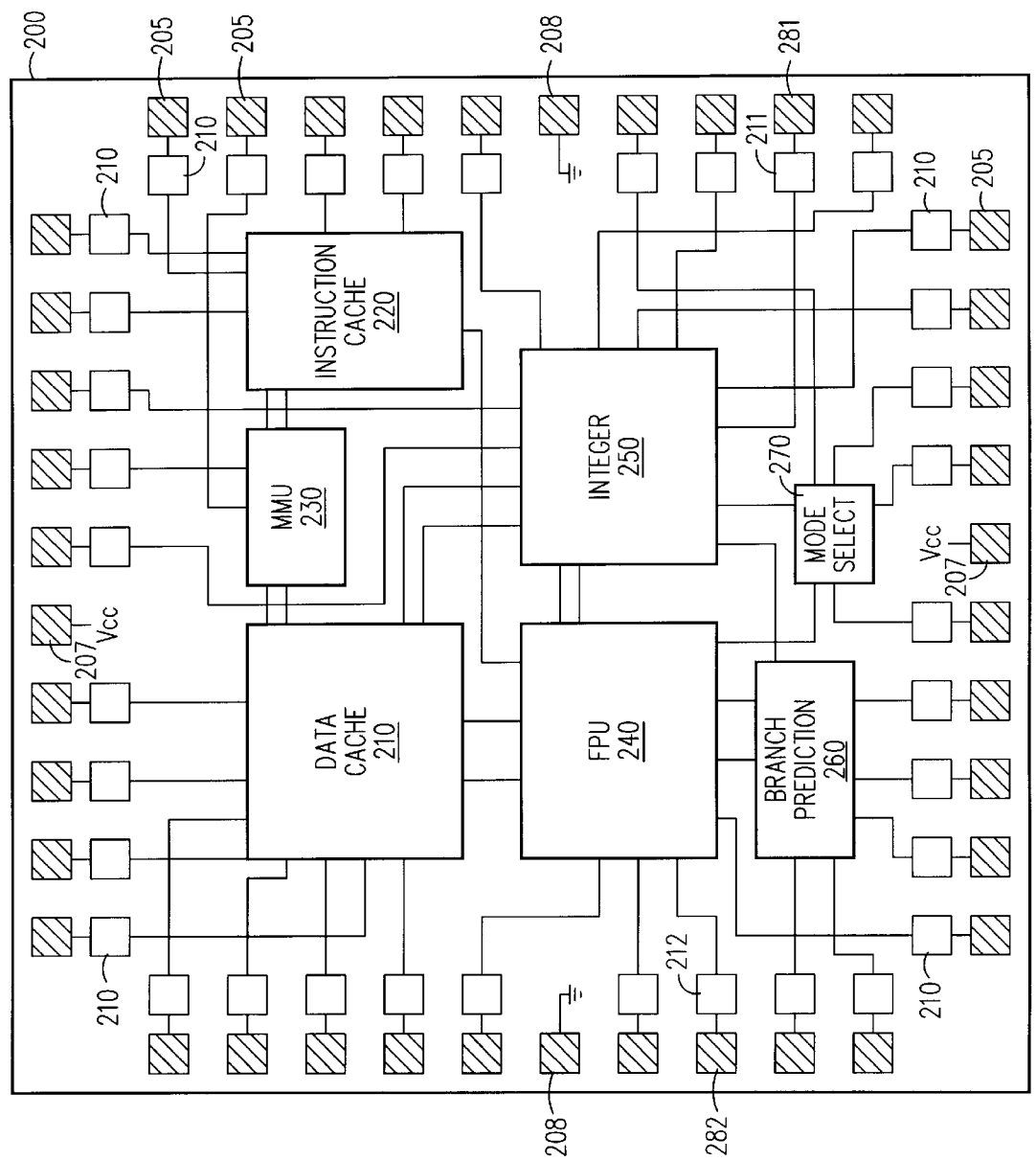
FIG. 2 shows a simplified representation of a die containing a microprocessor having a multitude of bonding pads and interface cells.
Figure 6:
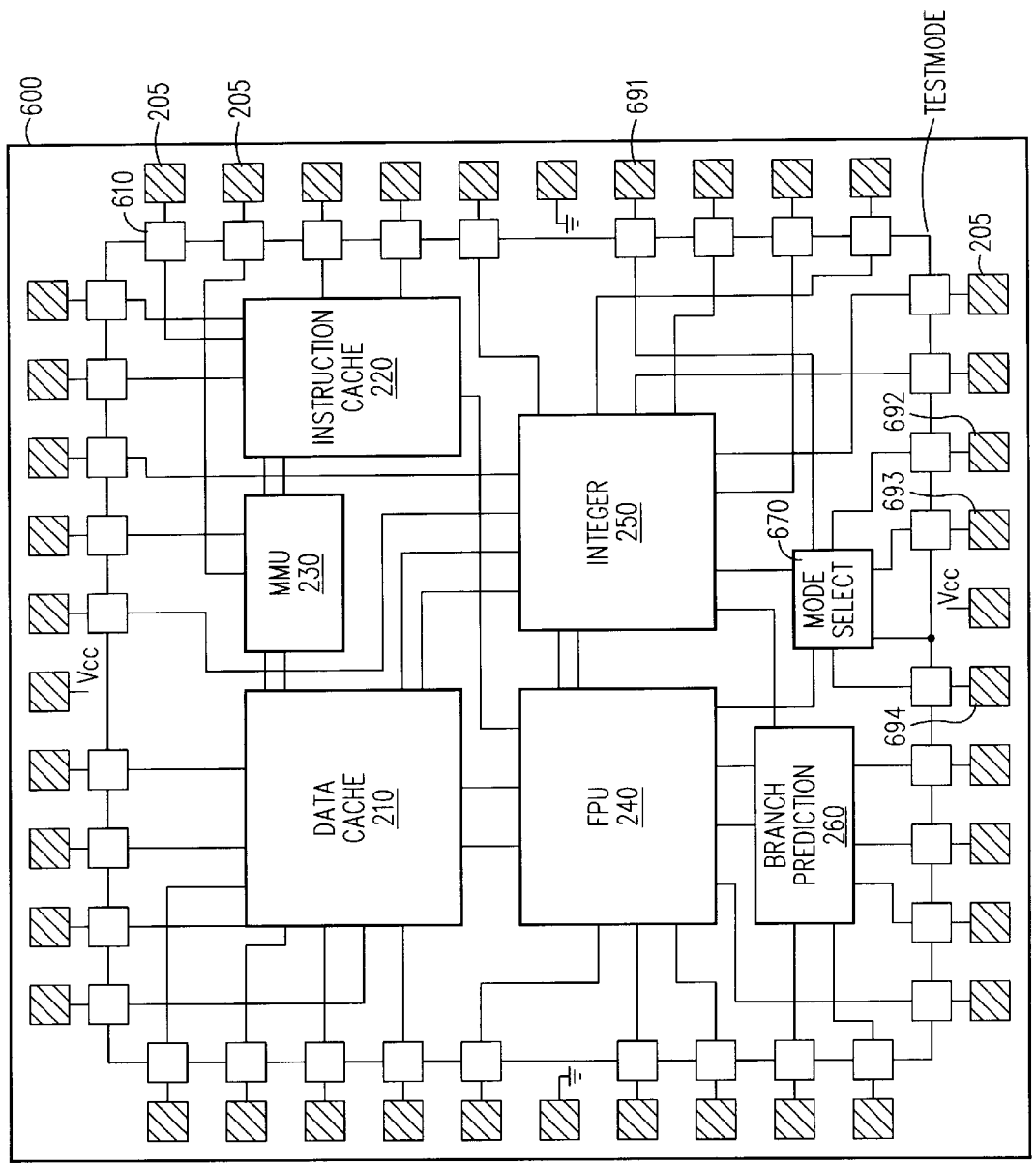
FIG. 6 shows a simplified representation of a die, containing a microprocessor having a multitude of bonding pads and interface cells, according to one embodiment of the present invention.

FIG. 6 shows a simplified representation of a single die containing a microprocessor according to one embodiment of the present invention. Dies containing other types of integrated circuits such as DRAMs, programmable logic devices (PLDs), SRAMs, and multimedia chips would also benefit from the present invention. Die 600 is very similar to die 200 of FIG. 2. However, the input cells of die 600 incorporate an active logic setting circuit. Furthermore, die 600 has a test mode control line TESTMODE for the input cells. Test mode control line TESTMODE, is shown to connect to all the interface cells 610. However, the test mode control line TESTMODE is only needed in the input cells. In die 600, test mode control line TESTMODE is generated by mode select unit 670 based on the signals provided mode select unit 670 by probes attached to bonding pads 691–694. However other methods of generating test mode control line TESTMODE is also possible. For example, test mode control line TESTMODE can also be driven by a probe through a bonding pad and an input cell. In other embodiments, multiple test mode control lines are used. Thus different subsets of input cells incorporating an active logic setting circuits can be selectively forced to a definite logic level. Furthermore, in some embodiments of the invention, multiple test mode control lines are used so that an input cell, such as dedicated inverting input cell 500 in FIG. 5, or an input/output cell can be set to different logic levels.

Since the input cells of die 600, are driven to a definite logic level during testing, probes need only be attached to the bonding pads of die 600 which are required by the test. Thus if only data cache 210 is being tested, probes are required only on the bonding pads which are needed to test data cache 210; since the unprobed bonding pads are connected to unprobed input cells which are driven to a definite logic level. Similarly, if only floating point unit 240 is being tested, probes are required only on the bonding pads which are needed to test floating point unit 240. In a real microprocessor having approximately 300 bonding pads such as the UltraSPARC I, only about 50 bonding pads are required to test the built in SRAM cache.

In the various embodiments of this invention, a method and structure has been described that eliminates the problem of probe overcrowding in prior art wafer testing methods. The use of an active logic setting circuit in the input cells of a die removes the necessity of connecting a probe to every bonding pad, that is coupled to an input cell.

The various embodiments of the structure and method of this invention that are described above are illustrative only of the principles of this invention and are not intended to limit the scope of the invention to the particular embodiments described. In view of this disclosure, those skilled-in-the-art can define other active logic setting circuits, other dedicated input cells, other input/output cells, other types of integrated circuits, and use these alternative features to create a method, circuit, or system according to the principles of this invention.

We claim:

1. An integrated circuit die comprising:

a plurality of bonding pads;

a plurality of input cells, wherein each of said input cells includes a first input cell line coupled to a different one of said bonding pads;

a first plurality of active logic setting circuits, wherein each of said active logic setting circuits includes a first active logic setting circuit line and a second active logic setting circuit line wherein said first active logic setting circuit line is coupled to said first input cell line of a different one of said input cells to form a first subset of input cells having an active logic setting circuit of said first plurality; and a control signal line coupled to said second active logic setting circuit line of each active logic setting circuit of said first plurality, wherein on an active signal level on said control signal line, said active logic setting circuits of said first plurality pull signals on said first input cell lines of said input cells of said first subset to a first definite logic level with a weak driving force.

2. The integrated circuit die of claim 1, wherein said first definite logic level is logic high.

3. The integrated circuit die of claim 1, wherein said first definite logic level is logic low.

4. The integrated circuit die of claim 1, wherein each of said active logic setting circuits includes a n-channel transistor.

5. The integrated circuit die of claim 1, wherein each of said active logic setting circuits includes a p-channel transistor.

6. The integrated circuit die of claim 1, wherein said first subset of input cells includes all of said input cells.

7. The integrated circuit die of claim 1, wherein a control signal on said control signal line is generated within said integrated circuit die.

8. The integrated circuit die of claim 1, wherein a control signal on said control signal line is provided from a bonding pad.

9. The integrated circuit die of claim 1, wherein said integrated circuit die is a microprocessor.

10. The integrated circuit die of claim 1, wherein said integrated circuit die is part of a semiconductor wafer.

11. The integrated circuit die of claim 1, further comprising:
    a second plurality of active logic setting circuits, wherein each active logic setting circuit of said second plurality includes a third active logic setting circuit line and a fourth active logic setting circuit line wherein said third active logic setting circuit line is coupled to a first input cell line of a different input cell to form a second subset of input cells, wherein each input cell of said second subset is coupled to an active logic setting circuit of said first plurality and an active logic setting circuit of said second plurality; and
    a second control signal line coupled to said fourth active logic setting circuit line of each active logic setting circuit of said second plurality, wherein on an active signal level on said second control signal line, said active logic setting circuits of said second plurality pull signals on said first input cell lines of said input cells of said second subset to a second definite logic level with a weak driving force.

12. The integrated circuit die of claim 11, wherein said second subset of input cells includes all of said first subset of input cells.

13. An integrated circuit die comprising
    a plurality of bonding pads;
    a plurality of input cells, wherein each of said input cells includes a first input cell line coupled to a different one of said bonding pads;
    a plurality of active logic setting circuits, wherein each of said active logic setting circuits includes a first active logic setting circuit line coupled to said first input cell line of a different one of said input cell; and a second active logic setting circuit line;
    a first control signal line coupled to said second active logic setting circuit line of each of a first subset of active logic setting circuits in said plurality, wherein said first subset of active logic setting circuits is coupled to a first subset of input cells in said plurality of input cells, and further wherein on an active signal level on said first control signal line, said first subset of active logic setting circuits pull signals on said first input cell lines of said first subset of input cells to a first definite logic level with a weak driving force; and
    a second control signal line coupled to said second active logic setting circuit line of each of a second subset of active logic setting circuits in said plurality, wherein said second subset of active logic setting circuits is coupled to a second subset of input cells in said plurality of input cells, and further wherein on an active signal level on said second control signal line, said second subset of active logic setting circuits pull signals on said first input cell of said second subset of input cells to a second definite logic level with a weak driving force.

14. The integrated circuit die of claim 13, wherein said first definite logic level is logic high and said second definite logic level is logic low.

15. The integrated circuit die of claim 13, wherein said first definite logic level is logic high and said second definite logic level is logic high.

16. The integrated circuit die of claim 13, wherein said first definite logic level is logic low and said second definite logic level is logic low.

17. The integrated circuit die of claim 13, wherein each of said active logic setting circuits includes a n-channel transistor.

18. The integrated circuit die of claim 13, wherein each of said active logic setting circuit includes a p-channel transistor.

19. The integrated circuit die of claim 13, wherein each of said first subset of active logic setting circuits includes a n-channel transistor, and each of said second subset of active logic setting circuits includes a p-channel transistor.

20. A method of testing a die having a plurality of input cells and a plurality of bonding pads, wherein each of said input cells is coupled to one of said bonding pad; said method comprising
    connecting a plurality probes to a first subset of said bonding pads to define a plurality of probed bonding pads and a plurality of unprobed bonding pads, wherein each of said unprobed bonding pads is coupled to an unprobed input cell;
    generating a first control signal to a first subset of said unprobed input cells;
    pulling a signal on a line in each of said unprobed input cells in said first subset to a first definite logic level in response to said first control signal;
    driving a plurality of input signals on a first subset of probes; and
    monitoring a plurality of output signals on a second subset of probes.

21. The method of testing a die in claim 20, wherein said generating a first control signal to a first subset of said unprobed input cells, includes generating said control signal to all of said input cells.

22. The method of testing a die in claim 20, wherein said first definite logic level is logic low.

23. The method of testing a die in claim 20, wherein said first definite logic level is logic high.

24. The method of testing a die in claim 20, further comprising:
    generating a second control signal to a second subset of said unprobed input cells; and
    pulling a signal on a line in each of said unprobed input cells in said second subset to a second definite logic level in response to said second control signal.

25. The method of testing a die in claim 24, wherein said first definite logic level is logic low and said second definite logic level is logic low.

26. The method of testing a die in claim 24, wherein said first definite logic level is logic high and said second definite logic level is logic low.

27. The method of testing a die in claim 24, wherein said first definite logic level is logic high and said second definite logic level is logic high.

28. An integrated circuit die comprising:
    a plurality of bonding pads;
    a plurality of input cells, wherein each of said input cells includes a first input cell line coupled to a different one of said bonding pads;
    a first plurality of n-channel transistors, wherein each of said n-channel transistors has a source terminal coupled to a different one of said first input cell lines in a first subset of input cells in said plurality of input cells and a drain terminal coupled to ground; and
    a control signal line coupled to a gate of each of said n-channel transistors of said first plurality, wherein on an active signal level on said control signal line, said n-channel transistors of said first plurality pull signals on said first input cell lines of each of said input cells of said first subset to a first definite logic level.

29. An integrated circuit die comprising:
    a plurality of bonding pads;
    a plurality of input cells, wherein each of said input cells includes a first input cell line coupled to a different one of said bonding pads;
    a first plurality of active logic setting circuits, wherein each of said active logic setting circuits includes a first active logic setting circuit line and a second active logic setting circuit line wherein said first active logic setting circuit line is coupled to said first input cell line of a different one of said input cells to form a first subset of input cells having an active logic setting circuit of said first plurality; and
    a control signal line coupled to said second active logic setting circuit line of each active logic setting circuit of said first plurality, wherein on an active signal level on said control signal line, said active logic setting circuits of said first plurality pull signals on said first input cells lines of said input cells of said first subset to a first definite logic level and wherein said plurality of active logic setting circuits are controlled solely by said control signal line.

30. The integrated circuit die of claim 4, wherein
    each of said input cells includes an input cell n-channel transistor having a first gate length;
    each of said n-channel transistors of said active logic setting circuits has a second gate length; and
    said second gate length is greater than said first gate length.

31. The integrated circuit die of claim 30, wherein said first gate length is 0.42 microns and said second gate length is at least 0.49 microns.

* * * * *

UNITED STATES PATENT AND TRADEMARK OFFICE
CERTIFICATE OF CORRECTION

PATENT NO. : 5,870,408
DATED : February 9, 1999
INVENTOR(S) : Sandeep K. Aggarwal, David F. Bertucci, Marc E. Levitt It is certified that error appears in the above-identified patent and that said Letters Patent is hereby corrected as shown below:

<u>Column 8, claim 13,</u>
Line 12, insert "lines" after -- cell --.

Signed and Sealed this

Sixth Day of November, 2001

Attest:

NICHOLAS P. GODICI
*Attesting Officer*     *Acting Director of the United States Patent and Trademark Office*